United States Patent [19]

Limberg

[11] 4,389,619

[45] Jun. 21, 1983

[54] ADJUSTABLE-GAIN CURRENT AMPLIFIER FOR TEMPERATURE-INDEPENDENT TRIMMING

[75] Inventor: Allen L. Limberg, Titusville, N.J.

[73] Assignee: RCA Corporation, New York, N.Y.

[21] Appl. No.: 230,383

[22] Filed: Feb. 2, 1981

[51] Int. Cl.$^3$ .............................................. H03F 3/04
[52] U.S. Cl. ...................................... 330/288; 330/289
[58] Field of Search ..................... 330/288, 289, 307; 307/297; 323/315, 316

[56] References Cited

U.S. PATENT DOCUMENTS

| | | | |
|---|---|---|---|
| 3,835,410 | 9/1974 | Wittlinger | 330/288 |
| 3,873,933 | 3/1975 | Wheatley, Jr. | 330/257 |
| 3,887,863 | 6/1975 | Brokaw | 323/19 |
| 3,930,172 | 12/1975 | Dobkin | 307/297 |
| 4,137,506 | 1/1979 | Iwamatsu et al. | 330/288 |
| 4,243,948 | 1/1981 | Schade, Jr. | 330/289 |
| 4,268,759 | 5/1981 | Gilbert | 307/490 |

OTHER PUBLICATIONS

S. Pookaiyaudom et al., "Precise Wide-Dynamic Range Constant Current Ratio Circuits", *Proceedings of the IEEE*, vol. 65, No. 10, Oct. 1977, pp. 1514–1515.

B. Gilbert et al., "A Wideband Two-Quadrant Analog Multiplier", *Digest of Technical Papers, 1980 IEEE International Solid-State Circuits Conference*, Feb. 1980, FAM 15.3, pp. 200–201.

*Primary Examiner*—James B. Mullins
*Attorney, Agent, or Firm*—E. M. Whitacre; P. J. Rasmussen; C. A. Berard, Jr.

[57] ABSTRACT

A current amplifier comprises four like-conductivity transistors on a substrate of an integrated circuit with a first pair connected in current mirror amplifier configuration. The third and fourth transistors have their respective bases cross-coupled to the other's collector, and their respective collector-emitter paths interposed serially between the respective emitters of the first and third transistors and a common terminal. Adjustable resistances external to the substrate are serially interposed between the emitters of the third and fourth transistors and the common terminal for adjusting the current gain of the current amplifier.

17 Claims, 3 Drawing Figures

ADJUSTABLE-GAIN CURRENT AMPLIFIER FOR TEMPERATURE-INDEPENDENT TRIMMING

The present invention relates to adjustable-gain current amplifiers adapted for providing off-chip, temperature-independent adjustment for monolithic integrated circuitry, particularly as related to extrapolated band-gap voltage regulators.

In extrapolated band-gap voltage regulators, two transistors are operated at different emitter current densities to develop a difference $\Delta V_{BE}$ between their respective base-emitter conduction potentials. That difference potential, which exhibits a positive temperature coefficient (PTC), is scaled upwards to provide a larger PTC potential, usually by means of resistor ratios. The larger PTC potential is summed with the conduction potential of a semiconductor junction, which exhibits a negative temperature coefficient (NTC). The summed voltage can be made to exhibit a substantially reduced temperature coefficient, for example, substantially zero temperature coefficient (OTC). Owing to variations in the diffusion of impurities into the basic semiconductor material and the resulting departure of the transistor parameters from the design center value, it is common to adjust the difference potential $\Delta V_{BE}$ so that the regulator output voltage is adjusted to the band-gap voltage $V_{BG-O}$ extrapolated to zero degrees Kelvin, which approximates 1.2 volts for silicon transistors, or to an integral multiple of $V_{BG-O}$.

To that end, a current amplifier employed to establish the different emitter current densities in the two transistors can have adjustable gain. In conventional current mirror amplifiers, as the gain is adjusted to depart from a nominal (design center) value, the base-emitter voltages ($V_{BE}$s) of the two transistors differ causing undesirable gain errors. Because the temperature-dependencies of those $V_{BE}$s also differ, the gain will undesirably vary with operating temperature as well. Gain-setting elements are on-chip in conventional current amplifiers, so that they will be operated at substantially the same temperature as the amplifier transistors. Adjustment to the on-chip elements can be accomplished by selective metalization, laser beam trimming, and closely monitored diffusion processes, each of which is undesirably inconvenient and expensive.

An adjustable-gain current amplifier employing an off-chip adjustment circuit obviates the need for on-chip adjustment and surprisingly provides for temperature-independent trimming when the transistors are interconnected to exhibit temperature-independent differences in base-emitter potentials. The advantages of such arrangement, in addition to convenience, are that a user of the IC can select and tailor the resistor type and value to the particular application and can perform the adjustment in situ to optimize performance.

A current amplifier having adjustable gain and embodying the present invention comprises a substrate having input and output terminals and first and second terminals; and having first, second, third and fourth resistors of like conductivity type on the substrate. The respective output electrodes of the first and second transistors respectively connect to the input and output terminals, and the respective common electrodes of the third and fourth transistors respectively connect to the first and second terminals. The common electrode of the first transistor connects to the output electrode of the third transistor and to the input electrode of the fourth transistor, and the common electrode of the second transistor connects to the output electrode of the fourth transistor and to the input electrode of the third transistor. The output electrode of the first transistor is coupled to its input electrode and to the input electrode of the second transistor to condition them for conduction. First and second resistances external to the substrate respectively connect the first and second terminals respectively to a common terminal, the first and second resistances exhibiting resistances in proportion substantially unaffected by temperature, and at least one of the resistances being adjustable.

In the following descriptions, the relatively small base currents of the bipolar transistors are neglectd to simplify the explanation of the operation of the circuits described. It is noted that those base currents do not substantially change the operation or performance from that described.

Figure 1:
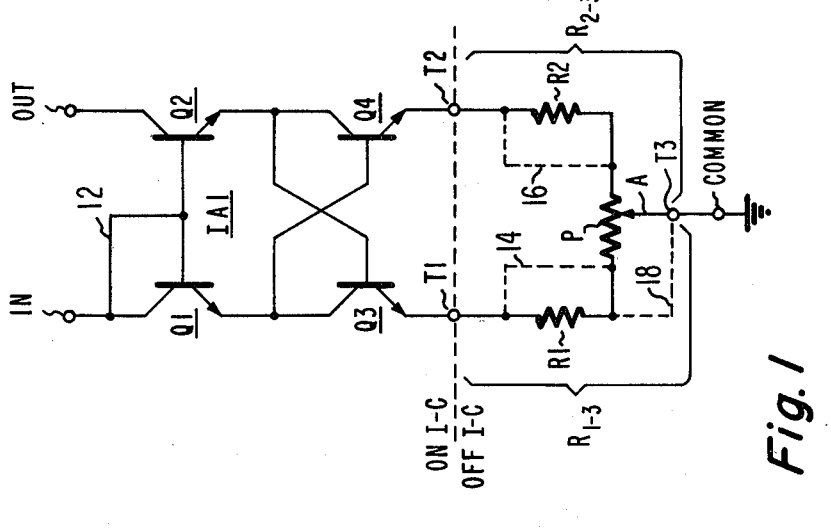
FIG. 1 is a schematic diagram of an adjustable-gain current amplifier embodying the present invention.

In FIG. 1, if the emitters of Q1 and Q2 were connected directly to the COMMON terminal, connection 12 would complete the connection of Q1 and Q2 in simple current mirror amplifier configuration. Current applied to terminal IN would establish base-emitter potential by virtue of d.c. feedback via connection 12 to condition Q1 to conduct substantially all the input current as collector current. The same potential is applied across the base-emitter of Q2 to condition it to demand collector current at terminal OUT substantially equal to the collector current of Q1, presuming Q1 and Q2 to be substantially similar in structure.

Interposing resistors R1 and R2 and potentiometer P between terminals T1 and T2 and T3 in the emitter circuits of Q1 and Q2 would provide a means for adjusting the current gain of the simple current mirror amplifier postulated above. If the adjustment arm A of potentiometer P were moved, for example, towards the left, resistance $R_{1-3}$ between T1 and T3 would be decreased and resistance $R_{2-3}$ between T2 and T3 would be increased. That difference in resistances would cause the base-emitter potentials of Q1 and Q2 to differ from each other so that the current at terminal OUT would decrease in relation to the current at terminal IN, i.e. the gain would be decreased. With such adjustment, the emitter current densities in Q1 and Q2 and their respective base-emitter conduction potentials $V_{BE}$ would thus differ. The current gain of the current amplifier would then depend on a difference, $\Delta V_{BE}$, between two $V_{BE}$'s for most gain adjustment settings.

Since $\Delta V_{BE}$ varies directly with temperature, the current gain of the current amplifier would undesirably change with change in IC temperature. Further, $\Delta V_{BE}$ is a function of the current levels in the input and output circuits of the current amplifier, which would introduce an undesired dependency of current gain on the current levels being handled.

Transistors Q3 and Q4 with their collectors cross-coupled to each other's bases are introduced to greatly reduce these problems. They have their respective common-emitter paths serially interposed in the emitter circuits of Q1 and Q2, respectively. Thus transistors Q1 and Q3 conduct current from terminal IN, and Q2 and Q4 conduct current to terminal OUT. The cross-coupling of the respective collectors and bases of Q3 and Q4 maintain equal potentials between terminals IN and T1 and between terminals IN and T2 irrespective of the relative values of input and output currents flowing at terminals IN and OUT. The potential between terminals IN and T1 is determined by the sum of the base-emitter potentials of Q2, which is conducting output current, and of Q3, which is conducting input current. In like manner, the potential between terminals IN and T2 is determined by the sum of the base-emitter potentials of Q1, which is conducting input current, and of Q4, which is conducting output current. Owing to the symmetrical connection structure, it is seen that the potentials at terminals T1 and T2 are substantially equal. As arm A of potentiometer P is adjusted, equal potentials are therefore impressed across each of the respective resistances $R_{1-3}$ and $R_{2-3}$ so that the input and output currents are in proportion determined substantially by the relative values of those resistances. The transistor $V_{BE}$s have substantially no effect on the proportion between input and output currents.

Transistors Q1, Q2, Q3 and Q4 are located on the IC substrate and so will operate at substantially the same temperature therefore to exhibit substantially similar transistor characteristics to each other irrespective of substrate operating temperature. Resistors R1, R2 and potentiometer P are located external to the integrated circuit (IC) substrate and the ratio of resistances $R_{1-3}$ and $R_{2-3}$ is adjustable. Because the resistances are off-chip, convenient adjustment is obtained as described above through adjustment of potentiometer P. The resistances $R_{1-3}$ and $R_{2-3}$ are maintained in substantially fixed proportion irrespective of their operating temperature, which need not be related to that of the IC. This is accomplished by selecting resistors that exhibit substantially the same temperature coefficient of resistance and by arranging them for operation at substantially the same temperature. Alternatively, resistances exhibiting substantially no change with temperature can be employed, in which case there is no need to track their operating temperatures; certain thin film resistors provide such OTC resistance.

In current amplifier IA1, the current gain between terminals IN and OUT depends only on the ratio of the emitter degeneration resistances $R_{1-3}$ and $R_{2-3}$ respectively of Q3 and Q4 and is independent of $V_{BE}$ modulation of transistors Q1, Q2, Q3 and Q4 caused by changes of the input and output current magnitudes and caused by changes in the operating temperature of the IC substrate. The present invention eliminates the problem of base-emitter potential differences caused by differing emitter current densities when one provides for adjusting the gain of the current amplifier by the ratio of resistances. The present invention obviates the need to track the operating temperatures between the transistors on one hand and the emitter degeneration resistors on the other; and provides a convenient means by which temperature-independent trimming can be accomplished external to the IC substrate.

Figure 2:
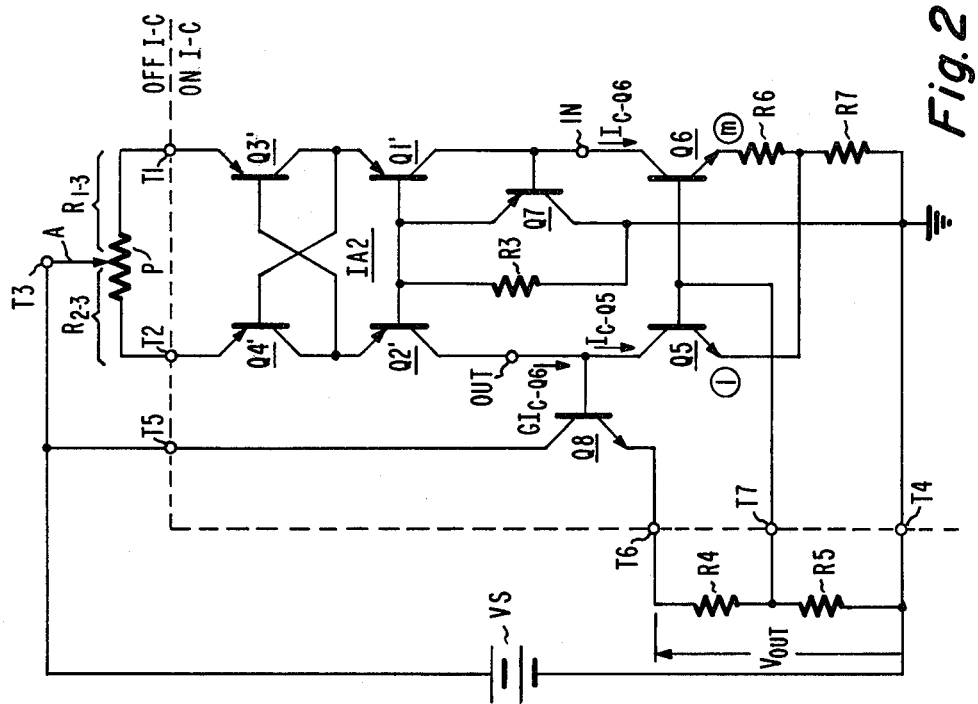
FIG. 2 shows an extrapolated band-gap voltage regulator utilizing an embodiment of the present invention.

Consider an extrapolated band-gap reference voltage regulator of the type described in U.S. Pat. No. 3,887,863 issued to A. P. Brokaw on June 3, 1975 and entitled "Solid State Regulated Voltage Supply". In FIG. 2, a Brokaw-type regulator is modified in that the collector currents of NPN transistors Q5 and Q6 which generate the $\Delta V_{BE}$ potential are combined by an adjustable-gain current amplifier IA2 of the general sort described in relation to FIG. 1.

Current amplifier IA2 differs from IA1 of FIG. 1 in that it employs PNP transistors Q1', Q2', Q3' and Q4' in place of NPN transistors Q1, Q3, Q3 and Q4, respectively, and in that the collector of Q1' is direct-coupled to its base by the emitter-follower action of PNP transistor Q7. Q1'-Q4' can be lateral-structure transistors. Q7 can be a vertical-structure transistor with collector region in the substrate, using conventional bipolar-transistor integrated circuit technology or can be a p-channel field-effect transistor to reduce base-current-related error in the current gain of IA2. The current gain of amplifier IA2 has a value $-G$, where $-G = (R_{1-3}/R_{2-3})$. Adjustable-tap connection A of potentiometer P is connected via terminal T3 to the positive pole of a direct voltage supply VS, shown as a battery.

The negative pole of VS is connected to terminal T4 of the integrated circuit (IC) as its most negative potential, to which voltage (as indicated by the connection to ground) the p-type substrate of the chip will be referred, assuming it to be constructed according to conventional bipolar-transistor technology. The positive pole of VS is connected to IC terminal T5 for supplying the collector bias of NPN transistor Q8. A relatively-high resistance resistor R3 provides a path for starting current to bias Q1'-Q4' into conduction. Emitter-follower transistor Q8 causes current flow to resistors R4 and R5 in voltage divider connection between T6 and T4 to develop the regulator output voltage $V_{OUT}$ therebetween.

(In the following description, the resistance value is indicated by a subscript symbol, e.g. $R_4$ is the resistance value of resistor R4 and so forth. Further, "k" is Boltzman's constant, "T" is absolute temperature in degrees Kelvin, and "q" is the charge of an electron.)

A fraction of the voltage $V_{OUT}$ is applied via terminal T7 to the joined base electrodes of Q5 and Q6 to draw them into conduction. Q5 and Q6 have collector-to-emitter conductances in 1:m ratio for like emitter-to-base voltages $V_{BE-Q5}$ and $V_{BE-Q6}$, m being a number larter than unity. That ratio can be provided by scaling the effective areas of their respective emitter-base junctions to be in 1:m ratio (as indicated by the encircled "1" and "m" near the emitters of Q5 and Q6, respectively). At start-up the emitter current levels of Q5 and Q6 are relatively low, and the potential drop across resistor R6 between their emitters responsive to the emitter current of Q6 is relatively small; so $V_{BE-Q5}$ and $V_{BE-Q6}$ differ little, and the Q6 collector current $I_{C-Q6}$ tends to be m times as large as the Q5 collector current $I_{C-Q5}$. The current $GI_{C-Q6}$ supplied from the terminal OUT of adjustable-gain current amplifier IA2, in response to $I_{C-Q6}$ demanded at its terminal IN, exceeds $I_{C-Q5}$; and there is increase in the base current supplied to Q8. The resulting increased emitter current of Q8 increases the voltage drop across the series connection of R4 and R5, completing a regenerative feedback loop tending to increase $V_{OUT}$. This tendency towards increase of $V_{OUT}$ is checked only when the voltage drop across R6 attains a value close to $(kT/q)\ln(mG)$ so that the current $GI_{C-Q6}$ supplied by current amplifier IA2 exceeds the $I_{C-Q5}$ by only a small error current—i.e., when the regenerative loop gain is reduced to unity. The Q6 emitter current at equilibrium is:

$$I_{E-Q6} = [(kT/q)\ln(mG)]/R_6 \tag{1}$$

Resistor R7, connecting the emitter electrode of Q5 to terminal T4, conducts not only the Q5 emitter current but also the Q6 emitter current. At equilibrium, the voltage drop across R7 is $$V_{R7} = (G+1)(R_7/R_6)(kT/q)\ln(mG). \quad (2)$$

The voltage between T4 and T7 has a value $V_{R7} + V_{BEQ5}$ and is supplied from voltage divider R4,R5 dividing the voltage $V_{OUT}$ between T4 and T6. $V_{OUT}$ at equilibrium is:

$$V_{OUT} = [(R_4+R_5)/R_5][V_{BE\text{-}Q5} + (G+1)(R_7/R_6)(kT/q)\ln(mG)]. \quad (3)$$

Within the second bracket in equation 3, the NTC component of $V_{OUT}$ obtains from the $V_{BE\text{-}Q5}$ term; the second term therein is the PTC component of $V_{OUT}$. It can be seen that increasing or decreasing G will trim the value of the PTC component so that an overall substantially zero temperature coefficient can obtain.

Figure 3:
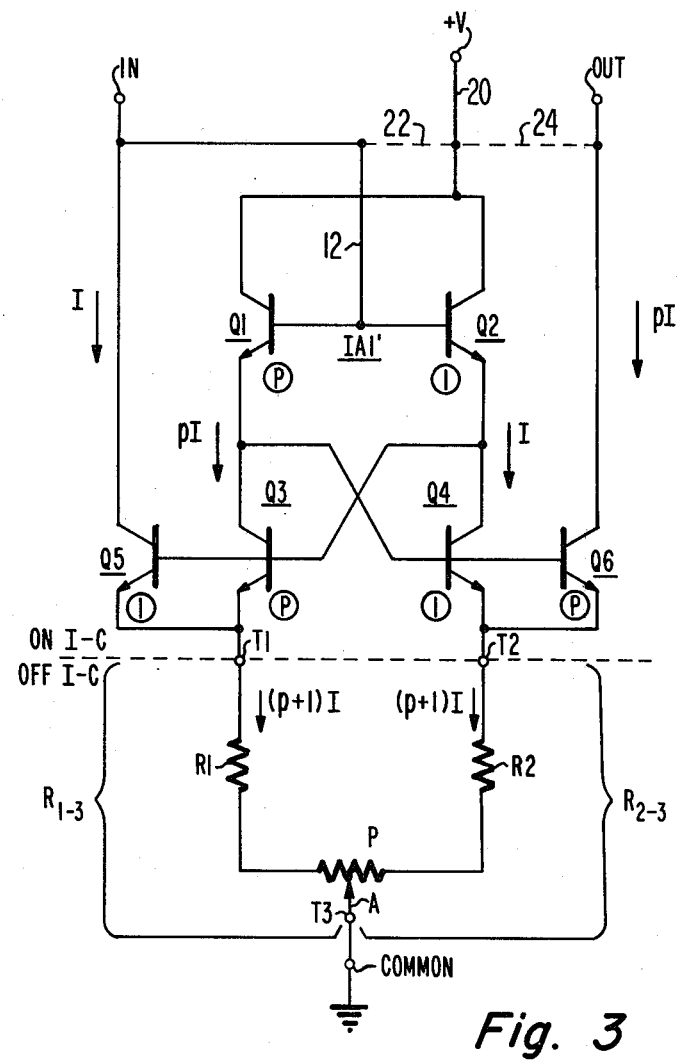
FIG. 3 is a schematic diagram of further embodiments of the present invention.

Current amplifier IA1' of FIG. 3 is modified with respect to IA1 of FIG. 1 in that NPN transistor Q5 and Q6 are added and in that the collector connections of Q1 and Q2 are modified. Rather than being connected to terminals IN and OUT, respectively, they are both connected by lead 20 to receive operating potential +V relatively positive with respect to ground. Terminals T2 and T3 are at substantially the same potential owing to the combining of base-emitter potentials of Q1-Q4 with respect to terminal IN in a manner similar to that described above in relation to IA1. Thus, temperature-independent trimming of current gain also obtains for IA1' through the adjustment of potentiometer P.

Transistors Q5 and Q6 conduct as their respective collector currents the current flowing through terminal IN and the current flowing through terminal OUT. The effective areas of the base-emitter junctions Q5 and Q6 are in 1:p ratio, p being a positive number. As a result, when their emitter-to-base voltages are equal, their emitter currents are in 1:p ratio. Because their collector currents are also in 1:p ratio, the current gain of IA1 is $$G = -p \quad (4)$$

Assume it is desired to achieve this condition at center-setting of potentiometer P, i.e. where $R_{1\text{-}3}$ and $R_{2\text{-}3}$ are equal resistances. The parallelled base-emitter junctions of Q3 and Q5 are made to have the same combined effective area as that of the parallelled base-emitter junctions of Q4 and Q6. Therefore, equal current flows through resistances $R_{1\text{-}3}$ and $R_{2\text{-}3}$ cause equal emitter-to-base voltages across each of the pairs of parallelled base-emitter junctions. That is, the effective areas of the base-emitter junctions of Q3, Q4, Q5 and Q6 are in p:1:1:p ratio, respectively, as indicated by the encircled values next to their respective emitters. Q3 conducts p times as much collector current as Q4 when $R_{1\text{-}3} = R_{2\text{-}3}$; so the emitter currents of Q1 and Q2 are in p:1 ratio. Equal emitter-to-base currents in the p:1 ratio are obtained by making the effective areas of the base-emitter junction areas of Q1 and Q2 in p:1 ratio with each other.

But it is noted that a current (1+p)I also flows to supply +V via lead 20 from Q1 and Q2. That current is beneficially utilized in variations of IA1' where it is desirable to achieve gains either larger or smaller than unity at center-setting of potentiometer P (i.e. when $R_{1\text{-}3}$ equals $R_{2\text{-}3}$). When lead 20 is removed and lead 22 (shown in phantom) connects the collectors of Q1 and Q2 to terminal IN, gains smaller than unity at center setting of potentiometer P are readily achieved because $$G = -p/(p+2) \quad (5)$$

which is always less than unity. One advantage of this arrangement is that values of G much less than unity obtain for values of p not departing widely therefrom. E.g., for $p=1$, $G=-\frac{1}{3}$. Values of p close to unity are desirable in integrated circuit fabrication so that close matching, and therefore minimal gain inaccuracies, will obtain. This type of current amplifier improves $V_{BG\text{-}0}$ supplies such as the type described by Brokaw. In similar fashion, by replacing lead 20 with lead 24 (shown in phantom) to connect the collectors of Q1 and Q2 to terminal OUT, current gains greater than unity obtain at center-setting of potentiometer P because $$G = -(2p+1) \quad (6)$$

which is always greater than unity. Modest values of p produce gains G further above unity than is p itself. E.g., for $p=2$, $G=-5$. Not only is the departure of gain G from unity achieved with desirably lesser departures of p therefrom, but those values of G are temperature-independent and adjustable as described above. This type of current amplifier improves $V_{BG\text{-}0}$ supplies which differ from the Brokaw type in that the feedback error signal is derived in inverse-phasing and then amplified in an inverting amplifier.

Modifications of the above embodiments are contemplated to be within the scope of the invention as defined by the following claims. For example, either or both of R1 or R2 can be eliminated as indicated by phantom connections 14 and 16. Alternatively, wiper-arm A of potentiometer P can be connected to one of its ends, as indicated by phantom connection 18. Further, transistors Q1, Q2, Q3, Q4, Q5 and Q6 (if used) could be either fabricated together on a monolithic IC substrate as described or could be attached to a hybrid circuit substrate subsequent to their fabrication.

In current amplifiers similar to that of FIG. 3 but constructed with lateral-structure PNP transistors, Q3 and Q5 may be replaced with a plural-collector transistor, and Q4 and Q6 may be replaced by another plural-collector transistor.

What is claimed is:

1. A current amplifier with adjustable current gain comprising:
   a substrate having input and output terminals, and having first and second terminals thereon;
   a common terminal external to said substrate;
   first, second, third and fourth transistors of like conductivity type arranged on said substrate, each having respective input, output and common electrodes, the respective output electrodes of said first and second transistors being respectively coupled said input and output terminals, the respective common electrodes of said third and fourth transistors respectively connecting to said first and second terminals, the respective common electrodes of said first and second transistors connecting to the respective output electrodes of said third and fourth transistors, respectively;
   means for applying a potential at the common electrode of said first transistor to the input electrode of said fourth transistor;

means for applying a potential at the common electrode of said second transistor to the input electrode of said third transistor;

means for applying a potential at said input terminal to the respective input electrodes of said first and second transistors to condition said first and second transistors for conduction;

first and second resistance means located external to said substrate, said first resistance means being coupled between said first and common terminals and said second resistance means being coupled between said second and common terminals, said first and second resistance means exhibiting respective resistances in proportion substantially unaffected by temperature, at least one of said first and second resistance means including means for adjusting the resistance thereof.

2. The current amplifier of claim 1 wherein said means for adjusting includes a potentiometer having a resistance path for serving as a portion of the resistance of said at least one of said first and second resistance means, and having an adjustment tap for connecting to a point on said resistance path, said tap coupling said at least one of said first and second resistance means to said common terminal.

3. In the current amplifier of claim 1 or 2 wherein the respective resistances of said first and second resistance means exhibit substantially similar temperature coefficients, means for arranging said first and second resistance means to operate at substantially similar temperatures.

4. The current amplifier of claim 1 wherein said first, second, third and fourth transistors are of bipolar type.

5. The current amplifier of claim 1 or 4 wherein said substrate is a monolithic integrated circuit.

6. A current amplifier with adjustable current gain comprising:

a substrate having input and output terminals, and having first and second terminals;

a common terminal;

first, second, third, fourth, fifth and sixth transistors of like conductivity type arranged on said substrate, each having respective input, output and common electrodes, the respective output electrodes of said fifth and sixth transistors respectively coupled to said input and output terminals, the respective common electrodes of said third and fifth transistors connecting to said first terminal, the respective common electrodes of said fourth and sixth transistors connecting to said second terminal, the respective common electrodes of said first and second transistors connecting to the respective output electrodes of said third and fourth transistors, respectively;

means for applying a potential at the common electrode of said first transistor to the input electrode of said fourth and sixth transistors;

means for applying a potential at the common electrode of said second transistor to the input electrode of said third and fifth transistors;

means for applying a potential at said input terminal to the respective input electrodes of said first and second transistors to condition said first and second transistors for conduction;

means for applying operating potentials to the output electrodes of said first and second transistors;

first resistance means coupled between said first and common terminals; and second resistance means coupled between said second and common terminals, said first and second resistance means exhibiting respective resistances in proportion substantially unaffected by temperature, at least one of said first and second resistance means including means for adjusting the resistance thereof.

7. The current amplifier of claim 6 wherein said means for adjusting includes a potentiometer having a resistance path for serving as a portion of the resistance of said at least one of said first and second resistance means, and having an adjustment tap for connecting to a point on said resistance path, said tap coupling said at least one of said first and second resistance means to said common terminal.

8. In the current amplifier of claim 6 or 7 wherein the respective resistances of said first and second resistance means exhibit substantially similar temperature coefficients, means for arranging said first and second resistance means to operate at substantially similar temperatures.

9. The current amplifier of claim 6 wherein said first, second, third, fourth, fifth and sixth transistors are of bipolar type.

10. The current amplifier of claim 6 wherein said means for applying operating potentials to the output electrodes of said first and second transistors essentially consists of means for applying a potential between said common terminal and the output electrodes of said first and second transistors.

11. The current amplifier of claim 6 wherein said means for applying operating potentials to the output electrodes of said first and second transistors essentially consists of means for applying potential at said input terminal to the output electrodes of said first and second transistors.

12. The current amplifier of claim 6 wherein said means for applying operating potentials to the output electrodes of said first and second transistors essentially consists of means for applying potential at said output terminal to the output electrodes of said first and second transistors.

13. In a reference potential generating circuit of the type wherein first and second transistors are conditioned to conduct respective first and second currents so as to operate at different current densities for developing a difference potential having a positive temperature coefficient, said difference potential being proportionally increased and summed with the forward conduction potential of a semiconductor junction having a negative temperature coefficient, the reference potential being derived from said sum, improved current amplifying means for proportioning said first and second currents comprising:

third and fourth transistors of like conductivity type, having output and common electrodes and respective main conduction paths therebetween serially coupled for receiving as input current said first current, their respective output electrodes being more proximate to said first transistor than their common electrodes, and having respective input electrodes;

fifth and sixth transistors of like conductivity type having output and common electrodes and respective main conduction paths therebetween serially coupled for supplying as output current said second current, their respective output electrodes being more proximate to said second transistor than their common electrodes;

means for applying a potential at the output electrode of said third transistor to the respective input electrodes of said third and fifth transistors to condition them to conduct said input and output currents, respectively;

means for applying potentials at the respective common electrodes of said third and fifth transistors to the respective input electrodes of said sixth and fourth transistors, respectively;

first and second resistance means for respectively coupling the common electrodes of said fourth and sixth transistors to a point of operating potential, said resistance means exhibiting resistances related in a proportion unaffected by temperature.

14. The improvement of claim 13 wherein said first and second resistance means include a potentiometer having a resistance path for serving as a portion of the resistance of at least one of said first and second resistance means, and having an adjustment tap for connecting to a point on said resistance path, said tap coupling said at least one of said first and second resistances to said point of operating potential.

15. The improvement of claim 14 further including a substrate on which said third, fourth, fifth and sixth transistors are arranged.

16. The improvement of claim 15 wherein said substrate is a monolithic integrated circuit further including said first and second transistors thereon.

17. A current amplifier with adjustable current gain comprising:

first and second terminals;

input, output, and common terminals;

first and second transistors having respective collector electrodes respectively coupled to said input terminal and to said output terminal, having respective emitter electrodes respectively coupled to said first terminal and to said second terminal, having respective base electrodes, and having respective base-emitter junctions with differing effective areas;

means for applying potential at said input terminal to the base electrode of said first transistor;

means for applying potential at said input terminal to the base electrode of said second transistor;

first and second resistance means coupled between said common terminal and said first and second terminals respectively, at least one of said first and second resistance means including means for adjusting the resistance thereof; and means for parallelling at least one of the base-emitter junctions of said first and second transistors with the base-emitter junction of a respective further transistor having a collector electrode coupled to receive an operating potential, the effective area of each further transistor being selected for making substantially equal the total effective area of the base-emitter junctions of transistors with emitter electrodes connected to each of said first and second terminals.

* * * * *

UNITED STATES PATENT AND TRADEMARK OFFICE
CERTIFICATE OF CORRECTION

PATENT NO. : 4,389,619
DATED : June 21, 1983
INVENTOR(S) : Allen LeRoy Limberg

It is certified that error appears in the above-identified patent and that said Letters Patent is hereby corrected as shown below:

| | |
|---|---|
| Column 4, line 42 | "larter" should be --larger--. |
| Column 7, line 44 | after "transistors" insert --being--. |
| Title page | under "[56] References Cited" add --4,366,444 12/1982 Schade, Jr. ..... 330/256--. |

Signed and Sealed this

Twentieth Day of September 1983

[SEAL]

Attest:

Attesting Officer

GERALD J. MOSSINGHOFF

Commissioner of Patents and Trademarks